(12) United States Patent
Yamamoto (10) Patent No.: US 6,803,320 B2
(45) Date of Patent: Oct. 12, 2004

(54) PROTECTIVE TAPE APPLYING AND SEPARATING METHODS

(75) Inventor: Masayuki Yamamoto, Osaka (JP)

(73) Assignee: Nitto Denko Corporation, Osaka (JP)

( * ) Notice: Subject to any disclaimer, the term of this patent is extended or adjusted under 35 U.S.C. 154(b) by 163 days.

(21) Appl. No.: 10/262,881

(22) Filed: Oct. 3, 2002

(65) Prior Publication Data

US 2003/0064592 A1 Apr. 3, 2003

(30) Foreign Application Priority Data

Oct. 3, 2001 (JP) ......................................... 2001-307411

(51) Int. Cl.[7] .......................................... H01L 21/302
(52) U.S. Cl. ................... 438/710; 438/464; 438/33; 438/63; 438/113
(58) Field of Search ............................. 438/710, 464, 438/33, 113

(56) References Cited

U.S. PATENT DOCUMENTS

| | | | | |
|---|---|---|---|---|
| 5,480,842 A | * | 1/1996 | Clifton et al. ............... 438/464 |
| 5,776,799 A | * | 7/1998 | Song et al. .................. 438/118 |
| 5,840,614 A | * | 11/1998 | Sim et al. ..................... 438/464 |
| 6,039,830 A | * | 3/2000 | Park et al. .................... 156/267 |
| 6,048,749 A | * | 4/2000 | Yamada ........................ 438/64 |
| 6,153,536 A | * | 11/2000 | Brouillette et al. ......... 438/758 |
| 6,156,423 A | * | 12/2000 | Nagamoto et al. .......... 428/345 |
| 6,238,515 B1 | * | 5/2001 | Tsujimoto et al. ....... 156/379.8 |
| 6,245,677 B1 | * | 6/2001 | Haq ........................... 438/690 |
| 6,352,935 B1 | * | 3/2002 | Collins et al. .............. 438/708 |

FOREIGN PATENT DOCUMENTS

JP          2000-331968          11/2000

\* cited by examiner

*Primary Examiner*—John F. Niebling
*Assistant Examiner*—Olivia T. Luk
(74) *Attorney, Agent, or Firm*—Rader, Fishman & Grauer PLLC (57) ABSTRACT

A protective tape is applied by a tape applying mechanism on a surface of a wafer suction-supported by a chuck table. The protective tape is cut to the shape of the wafer by a cutter unit. This process is repeated a plurality of times to apply protective tape in a plurality of plies to the wafer surface. The protective tapes applied are separated successively, starting with an uppermost tape, by a separating mechanism of a tape separating apparatus.

15 Claims, 5 Drawing Sheets

PROTECTIVE TAPE APPLYING AND SEPARATING METHODS

BACKGROUND OF THE INVENTION (1) Field of the Invention

This invention relates to a technique for applying protective tape to a wafer surface with a pattern formed thereon and for separating the protective tape from the wafer surface.

(2) Description of the Related Art

In a conventional process of manufacturing semiconductor wafers, a mechanical method such as grinding or polishing, or a chemical method including etching, is used to process the back surfaces of semiconductor wafers (hereinafter simply called "wafers") to reduce the thickness thereof. When these methods are used to process the wafers, a protective tape is applied to the front surfaces of wafers in order to protect the front surfaces having wiring patterns formed thereon.

When a wafer is sent to a back-grinding process, the front surface (patterned surface) is suction-supported by a chuck table and the back surface is ground with a grinder. At this time, a protective tape is applied to the front surface to avoid the pattern being damaged under the stress of grinding occurring to the front surface, and to avoid contamination of the pattern.

The wafer thinned by grinding of its back surface could easily be broken during the processing or transportation. The wafer, due to its deflection or bending, is difficult to handle. In order to avoid such inconveniences, a proposal has been made to apply two different types of protective tape to a wafer surface beforehand to prevent damage and bending of the wafer (see Japanese Patent Publication (Unexamined) 2000-331968).

The use of protective tape in double plies as described in the above Japanese Patent Publication (Unexamined) 2000-331968 has an advantage in terms of wafer reinforcement, but has the following inconveniences encountered in the process of applying and separating the protective tape.

Generally when protective tape is applied to the surface of a wafer, an applicator roller is made to roll and press on the protective tape for applying it to the surface of the wafer while the protective tape is stretched in a direction of application. However, when applying the protective tape in two plies to the surface of a wafer as in the prior art, it is difficult to stretch the protective tape by means of the applicator roller because the protective tape itself is greater in rigidity than a single piece of tape. The stress generated at this point and acting on the wafer could damage the wafer.

Further, when separating the protective tape in two plies all at once, the high rigidity of the tape allows only an unsharp folding angle as the tape is folded for separation from the wafer. As a result, a strong pulling force is required to separate the protective tape. This strong pulling force acting on the thinned wafer could damage the wafer.

Further, when the protective tape applied in two plies to the wafer surface is cut along the periphery of the wafer, the thickness and rigidity encumber the cutting operation.

SUMMARY OF THE INVENTION

This invention has been made having regard to the state of the art noted above, and its primary object is to provide protective tape applying and separating methods capable of easily applying and separating protective tape to/from semiconductor wafers while reinforcing the wafers by giving rigidity thereto.

The above object is fulfilled, according to this invention, by a method of applying protective tapes to a surface of a semiconductor wafer with a pattern formed thereon, the method comprising a step of applying the protective tapes to the surface of the wafer by repeating a process of applying each of the protective tapes.

With the protective tape applying method according to this invention, individual protective tapes are applied to the surface of a wafer in a repeated operation, to facilitate handling, e.g. applying and cutting, of the protective tapes. That is, this method allows a protective tape of low rigidity to be handled as a unit, rather than handling a highly rigid protective tape formed in two plies in advance. Thus, the wafer is subjected to a reduced stress due to pressing and stretching of the protective tape during application of the protective tape. Only a single protective tape has to be cut along the wafer, which is easier than cutting a plurality of protective tapes at a time. An existing apparatus may be used to repeat the process of applying an individual protective tape to the surface of the wafer, without requiring special protective tape or apparatus. Thus, an apparatus for executing this method may be constructed at low cost.

In this invention, the protective tapes applied in a plurality of plies to the surface of the wafer, preferably, are progressively harder upward away from the surface.

A soft protective tape is directly applied to the patterned surface to absorb irregularities on the surface of the patterned surface, thereby rendering the surface level and smooth. Thus, a second and subsequent protective tapes may be applied substantially uniformly to the flat surface of the protective tape forming the under layer.

Further, it is preferred in this invention that the protective tapes applied in a plurality of plies to the surface of the wafer comprise a UV curable tape applied to the surface of the wafer, and a non-TV curable tape applied to the UV curable tape.

A UV irradiation of the UV curable tape applied to the surface of the wafer will reduce the adhesive strength of the tape. Thus, the protective tape may easily be separated from the surface of the wafer.

Further, it is preferable to apply each of the protective tapes in a different direction. For example, the protective tapes may be applied such that, after a first protective tape is applied to the surface of the wafer in a first direction, a next protective tape is applied in a direction perpendicular to the first direction.

By varying the direction for applying the protective tapes, the tension of the protective tapes is uniformly applied to the wafer. This is effective to correct a warp of the thinned wafer.

In another aspect of the invention, a method is provided for separating a plurality of protective tapes applied to a surface of a semiconductor wafer with a pattern formed thereon. This tape method comprises a step of individually separating the plurality of protective tapes in plural times starting with an uppermost tape.

With the protective tape separating method according to this invention, protective tapes applied in a plurality of plies to the surface of a wafer are separated one by one starting with an uppermost tape. Thus, the protective tapes may be separated with a relatively small pulling force. This reduces the stress due to the pulling force acting on the thinned wafer. The protective tapes may be separated easily from the surface of the wafer.

Preferably, the plurality of protective tapes are separated such that, after a first protective tape is separated in a first direction, a next protective tape is separated in a direction perpendicular to the first direction. Alternatively, the plurality of protective tapes may be separated by varying separating directions in accordance with the pattern on the surface.

Particularly, by separating the protective tapes along recesses in the patterned surface, the protective tapes may be separated efficiently without leaving an adhesive lodged in the recesses.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENTS

Preferred embodiments of this invention will be described hereinafter with reference to the drawings.

<Protective Tape Applying Method>

A tape applying apparatus for executing a protective tape applying method according to this invention will be described first with reference to the drawings.

Figure 1:
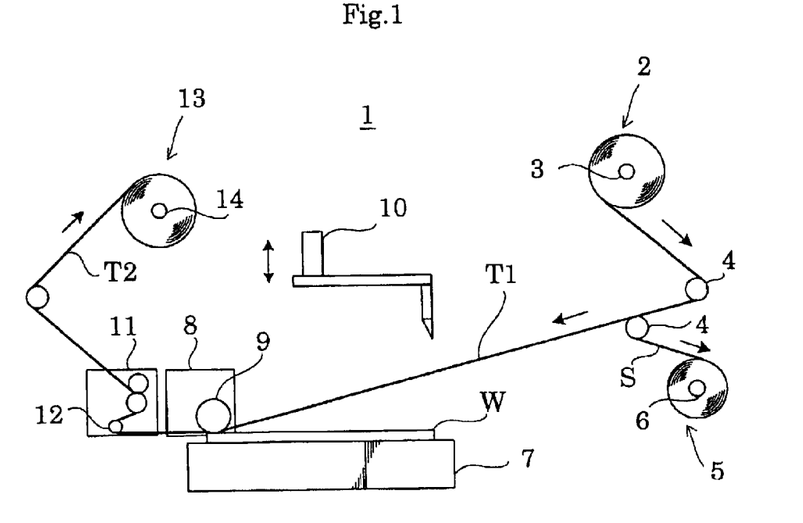
FIG. 1 is a front view showing an outline of a tape applying apparatus for executing a protective tape applying method.
Figure 2:
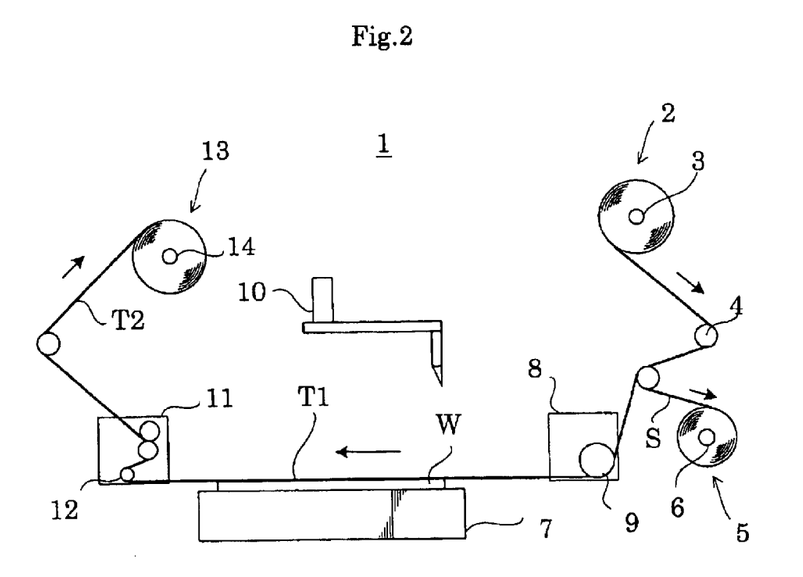
FIG. 2 is a schematic front view illustrating a tape applying process.
Figure 3:
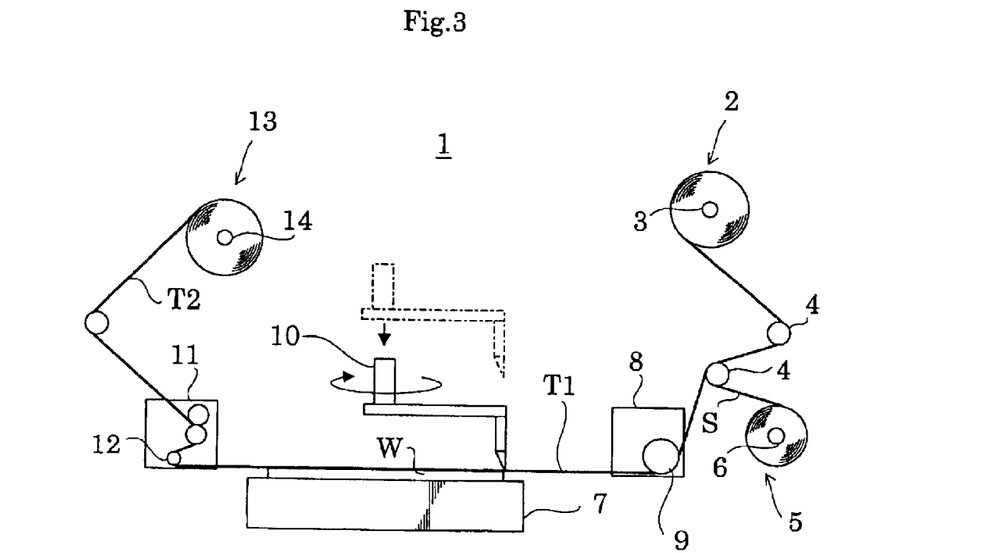
FIG. 3 is a schematic front view illustrating the tape applying process.
Figure 4:
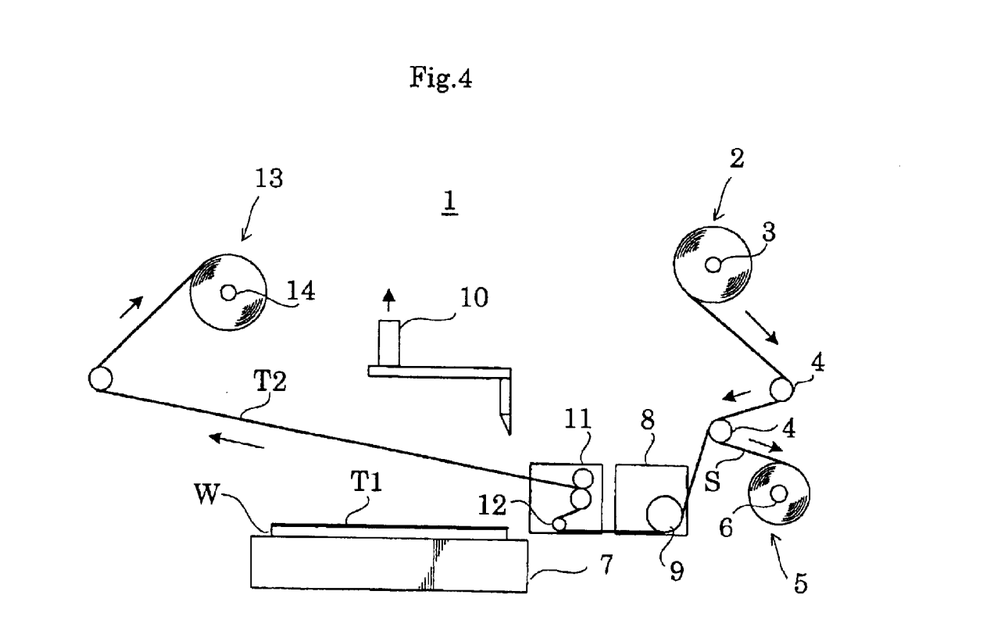
FIG. 4 is a schematic front view illustrating the tape applying process.

FIG. 1 is a front view showing an outline of a tape applying apparatus. FIGS. 2 through 4 are schematic front views illustrating a protective tape applying process.

An apparatus 1 for applying protective tape to semiconductor wafers, in this embodiment, has a tape server 2 for supplying protective tape T1 along with a separator S, a separator collector 5 for separating and collecting the separator S from the protective tape T1, a chuck table 7 for suction-supporting a semiconductor wafer W (hereinafter simply called "wafer W") thereon, a tape applying mechanism 8 for pressing and applying the protective tape T1 to the wafer W, a cutter unit 10 for cutting the protective tape T1 on the wafer W along the circumference of the wafer W, a tape separating mechanism 11 for separating residual tape T2 from the wafer W, and a tape collector 13 for collecting the separated tape.

The construction of each mechanism will be described in detail hereinafter.

The tape server 2 guides the protective tape T1 with separator S in a strip form drawn from a tape bobbin 3 to move around a group of guide rollers 4 in a winding manner. The tape bobbin 3 is supported by a vertical wall, not shown, and is checked against rotation by a braking mechanism or the like.

The separator collector 5 has a collecting bobbin 6 supported by the vertical wall not shown, and is operatively connected to a driving device such as a motor.

The chuck table 7 has guide pins for adjusting position of the wafer W placed thereon with reference to an orientation flat of the wafer, while suction supporting the wafer at the back surface thereof.

The tape applying mechanism 8 has a frame thereof held by a rail of a main body of the apparatus and operatively connected to a driving device such as a motor not shown, to be slidable in a tape running direction. The frame rotatably supports an applicator roller 9 which is vertically swung by a cylinder or the like not shown. Thus, the applicator roller 9 applies the protective tape T1 to the surface of the wafer W while pressing and rolling on the surface of the protective tape T1.

The cutter unit 10 is vertically movable by a lift mechanism, not shown, between a standby position and a cutting position for cutting the protective tape T1. The cutter unit 10 cuts the protective tape T1 along the circumference of the wafer W.

The tape separating mechanism 11 has a frame thereof held by the rail of the main body of the apparatus and operatively connected to a driving device such as a motor not shown, to be slidable in the tape running direction. The frame rotatably supports a separator roller 12 which is vertically swung by a cylinder or the like not shown. The separator roller 12 is provided to separate from the wafer W the residual tape T2 which is left thereon after the tape is cut along the circumference of the wafer W.

The tape collector 13 has a collecting bobbin 14 supported by the vertical wall not shown, and is operatively connected to a driving device such as a motor. That is, a predetermined quantity of protective tape T1 is drawn from the tape server 2 and fed onto the wafer W. The collecting bobbin 14 is driven by the driving device to wind up the residual tape T2 left after a cutting operation.

A method of applying protective tape in a plurality of plies, which is the characterizing feature of this embodiment, will be described with reference to the drawings, using the tape applying apparatus having the above construction. In this embodiment, two tape applying apparatus are used to apply two different types of protective tape in a plurality of plies to the surface of each wafer.

The two types of protective tape used in this embodiment are, for example, a soft substrate with a tensile modulus of 30 to 100 MPa and a hard substrate with a tensile modulus of 100 to 1000 Mpa, both coated with an adhesive. The tensile modulus has been measured, using samples of 1 cm$^2$, at a tension speed of 50 mm/min and in an environment of 23° C.

A first and a second tape applying apparatus are arranged side by side. A soft protective tape T1 is set on the tape bobbin 3 of the first tape applying apparatus and a hard protective tape T3 is set on the tape bobbin 3 of the second tape applying apparatus.

A wafer W is placed on, positionally adjusted to and suction-supported by the chuck table 7 of the first tape applying apparatus. At this point, as shown in FIG. 1, the tape applying mechanism 8 and tape separating mechanism 11 are in an initial position at the left side, and the cutter unit 10 in the upper standby position.

After the position of the wafer W is adjusted, the applicator roller 9 of the tape applying mechanism 8 is swung downward. Then the applicator roller 9 rolls in a direction opposite to the tape running direction (from left to right in FIG. 2.) while pressing down the protective tape T1. In this way, the protective tape T1 is applied uniformly over the surface of the wafer W. When the tape applying mechanism 8 reaches a terminal position, the applicator roller 9 is raised.

Next, as shown in FIG. 3, the cutter unit 10 is lowered to the cutting position to cut the protective tape T1. The cutter unit 10 is turned to make a complete circle circumferentially of the wafer W, thereby cutting out the protective tape T1 around the wafer W.

After cutting out the protective tape T1, the cutter unit 10 is raised back to the standby position as shown in FIG. 4.

Next, as shown in FIG. 4, the tape separating mechanism 11 takes up and separates the residual tape T2 left on the wafer W while moving over the wafer W in the direction opposite to the tape running direction.

When the tape separating mechanism 11 reaches a terminal position for the separating operation, the tape separating mechanism 11 and the tape applying mechanism 8 are moved in the tape running direction back to the initial position shown in FIG. 1. In the meantime, the residual tape T2 is rolled up by the collecting bobbin 14, while a predetermined quantity of tape is drawn from the tape server 2. This ends the operation for applying the protective tape T1 to the surface of the wafer W in the first tape applying apparatus.

The wafer W, with the protective tape T1 applied to the surface thereof in the first tape applying apparatus, is transferred to the second tape applying apparatus. When the wafer W is placed on the chuck table 7 of the second tape applying apparatus, an adjustment is made to apply the second protective tape T3 in a direction turned 90 degrees relative to the direction of applying the first protective tape T1.

Figure 5:
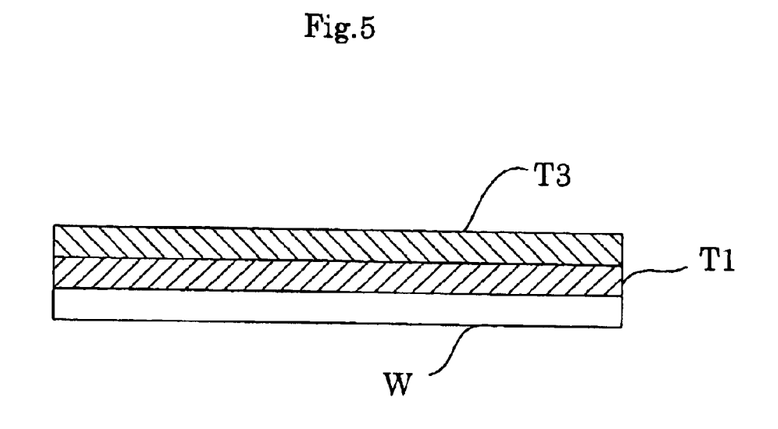
FIG. 5 is a side view of a wafer with protective tape applied in a plurality of plies thereto.

The same operation as for applying the first protective tape T1 is repeated to apply the second protective tape T3 over the first protective tape T1. This results in a wafer W with a surface having the two protective tapes T1 and T3 applied in plies thereto as shown in FIG. 5.

Protective tapes may be applied in a number of different combinations, e.g. a soft tape and a hard tape applied in the stated order to the surface of wafer W, a hard tape and a soft tape applied in this order, tapes of the same type, or a UV curable tape and a non-UV curable tape. The number of tapes applied is not limited to two, but may be more than two.

Where the combination of UV curable tape and a non-UV curable tape among the above combinations of protective tapes is used, for example, a UV irradiation of the protective tapes will ease separation of the UV curable tape, thus reducing the tensile force applied to the wafer on separation of this tape.

By repeatedly applying a plurality of protective tapes individually to the surface of wafer W by the above method, each protective tape may easily be stretched in the tape applying direction when the applicator roller 9 rolls and presses on the protective tape. This reduces excessive stress acting on the wafer W in time of pressing and stretching the protective tapes applied to the wafer W.

By applying the soft protective tape T1 to the surface of wafer W, irregularities on the surface of the wafer W are absorbed to render the surface level and smooth. As a result, the protective tape T3 may be applied uniformly over the first protective tape T1.

As noted hereinbefore, the second protective tape T3 is applied in a direction turned 90 degrees relative to the applying direction of the first protective tape T1. This is effective to correct a warp of the wafer caused by the tension acting in the tape applying direction when the first protective tape T1 is applied.

<Protective Tape Separating Method>

A tape separating apparatus for executing a protective tape separating method according to this invention will be described first with reference to the drawings.

Figure 6:
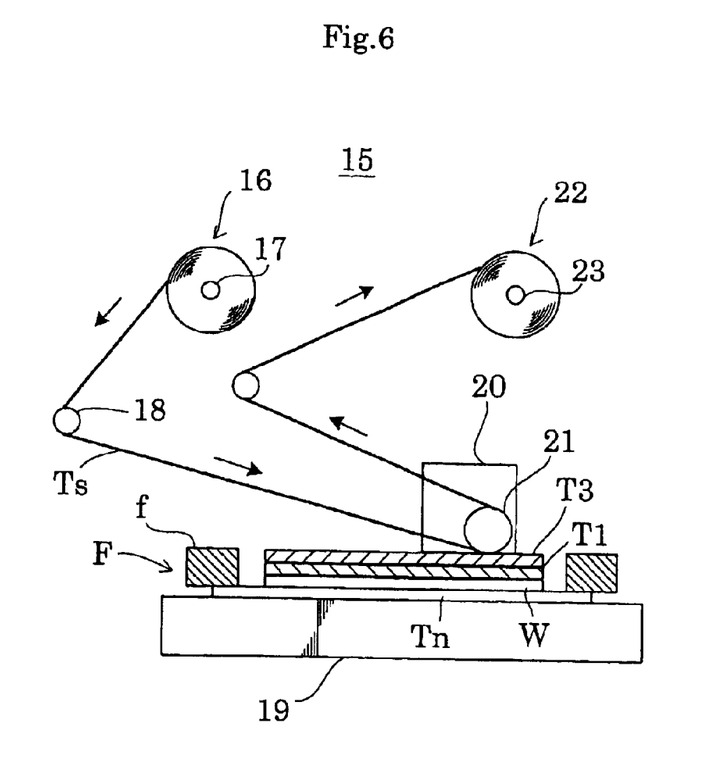
FIG. 6 is a front view showing an outline of a tape separating apparatus for executing a protective tape separating method.
Figure 7:
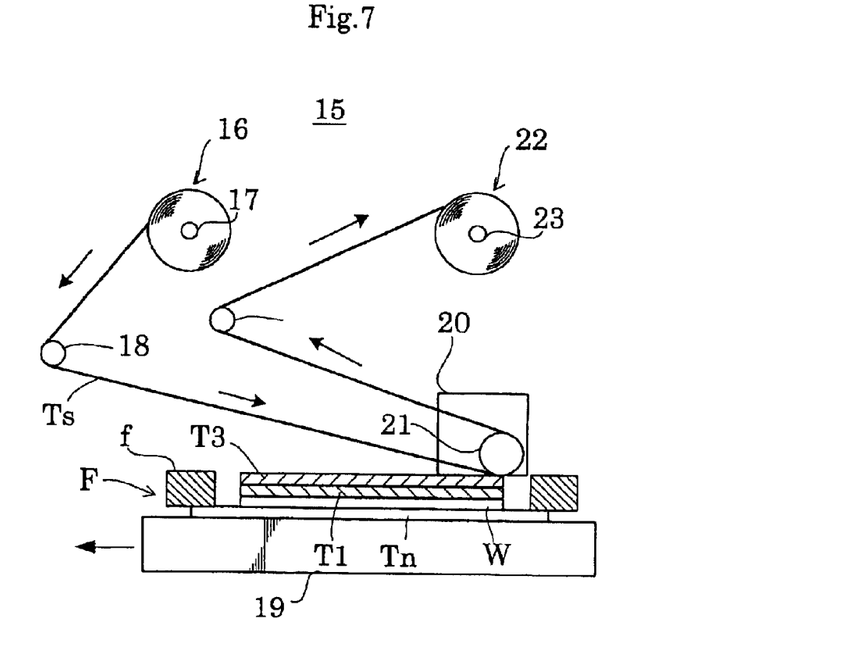
FIG. 7 is a schematic front view illustrating a tape separating process.
Figure 8:
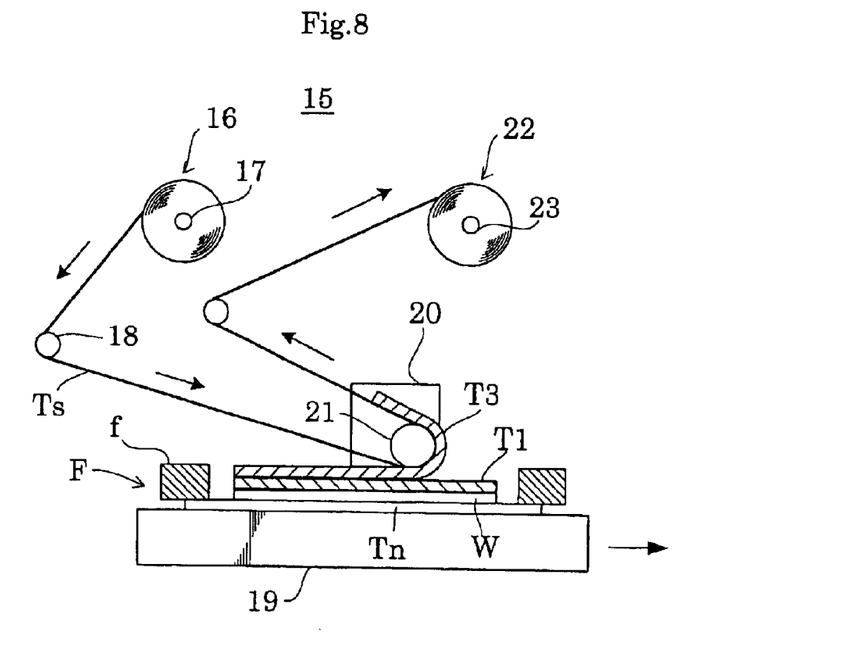
FIG. 8 is a schematic front view illustrating the tape separating process.
Figure 9:
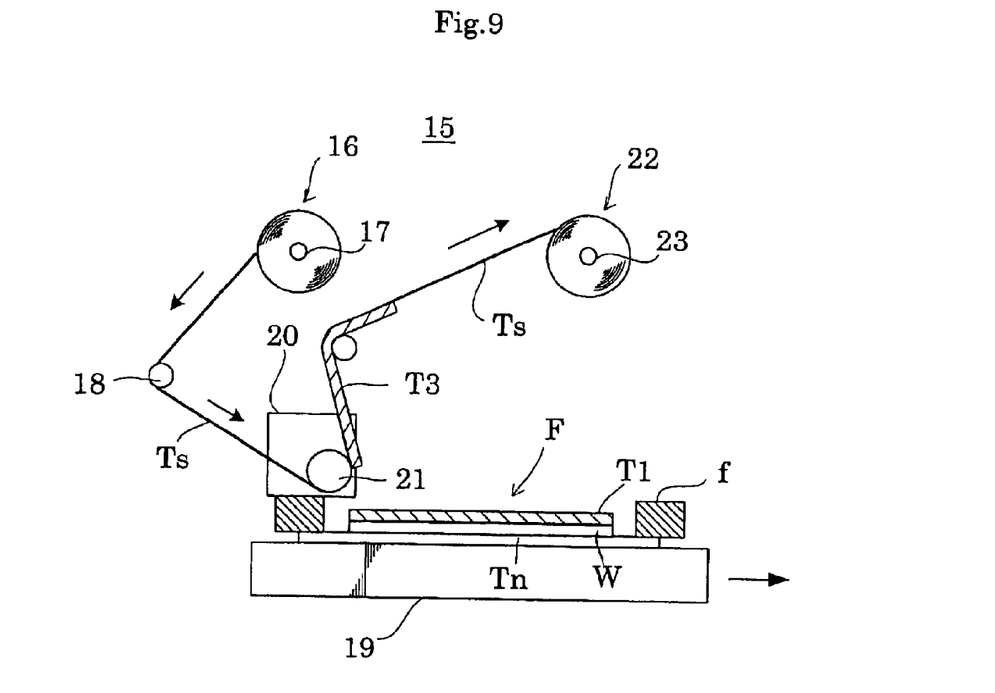
FIG. 9 is a schematic front view illustrating the tape separating process.

FIG. 6 is a front view showing an outline of a tape separating apparatus. FIGS. 7 through 9 are schematic front views illustrating a protective tape separating process.

An apparatus 15 for separating protective tape from semiconductor wafers, in this embodiment, has a tape server 16 for supplying a separating tape Ts, a chuck table 19 for suction-supporting a wafer W supported at the back surface thereof by a ring frame f through an adhesive tape Tn (hereinafter simply called "mount frame F"), a separating mechanism 20 for pressing and applying the separating tape Ts to the protective tape T3 applied over the surface of the wafer W and separating the separating tape Ts together with the protective tape T3, and a tape collector 22 for collecting both tapes separated from the wafer W.

The construction of each mechanism will be described in detail hereinafter.

The tape server 16 guides the separating tape Ts drawn from a tape bobbin 17 to the separating mechanism 20 by way of a guide roller 18. The tape bobbin 17 is supported by a vertical wall not shown.

The chuck table 19 has guide pins for adjusting position of the mount frame F transferred thereto. The chuck table 19 is constructed to suck the back surface of the mount frame F. Further, the chuck table 19 has a frame thereof held by a rail of a main body of the apparatus and operatively connected to a driving device such as a motor not shown, to be slidable in a running direction of the separating tape Ts.

The separating mechanism 20 has a separator roller 21 rotatably supported by a frame thereof and vertically swung by a cylinder or the like not shown. The separator roller 21 is operable to press and apply the separating tape Ts to the surface of the protective tape T3.

The tape collector 22 has a collecting bobbin 23 supported by the vertical wall not shown, and operatively connected to a driving device not shown. That is, a predetermined quantity of separating tape Ts is drawn from the tape server 16 and fed onto the wafer W. The collecting bobbin 23 is driven by the driving device to wind up the separating tape Ts joined with the protective tape T3.

A method of separating the protective tape in a plurality of plies from the surface of each wafer, which is the characterizing feature of this embodiment, will be described with reference to the drawings, using the tape separating apparatus having the above construction.

As shown in FIG. 7, for example, a mount frame F is placed on the chuck table 19, the mount frame F having a wafer W with two protective tapes T1 and T3 of different hardness levels applied thereto, the wafer W being supported at the back surface thereof by a ring frame f through an adhesive tape. The position of the mount frame F is adjusted, which is then suction-supported by the chuck table 19. Then, as shown in FIG. 7, the chuck table 19 is moved (leftward in FIG. 7) to a position having the separator roller 21 in contact with a peripheral portion of the wafer W.

After the position of the mount frame F is adjusted, as shown in FIG. 8, the separator roller 21 is swung down and the chuck table 19 is moved in the running direction of the separating tape Ts. With the movement of the chuck table 19, the separator roller 21 rolls over the wafer W pressing the separating tape Ts thereon. That is, the separating tape Ts is applied to the uppermost protective tape T3, and the protective tape T3 with the separating tape Ts adhering thereto is taken up and separated together with the separating tape Ts.

When the chuck table 19 reaches a terminal position as shown in FIG. 9, the separator roller 21 is moved upward and the chuck table 19 is moved counter to the tape running direction back to the initial position. In the meantime, the protective tape T3, which is joined and separated with the separating tape Ts, is wound up around the collecting bobbin 23, while a predetermined quantity of separating tape Ts is drawn from the tape server 16. This ends the operation for separating the uppermost one T3 of the protective tapes applied to the surface of the wafer W.

Next, an operation is carried out to separate the protective tape T1. Firstly, the orientation of the mount frame F on the chuck table 19 is changed. For example, the mount frame F may be turned 90 degrees relative to the direction of separating the protective tape T3, or may be turned so that the protective tape T1 is separated along any one of cross recesses in the patterned surface of the wafer W.

Once a direction for separating the protective tape T1 directly applied to the surface of wafer W is determined, the protective tape T1 is separated from the surface of wafer W by repeating the same operation for separating the protective tape T3.

The back surface of each protective tape is treated to prevent the tapes from sticking hard to each other when wound into a roll. Thus, the protective tapes are easily separated one by one starting with the uppermost tape.

The above method requires a relatively small pulling force for separating the protective tapes from the surface of wafer W, one by one starting from the uppermost tape. That is, the wafer W undergoes a reduced stress due to the tensile force of the tapes occurring in time of separating the tapes.

Where the protective tape directly applied to the surface of W is separated along a recess in the pattern, the adhesive may be removed altogether from the recess.

This invention is not limited to the foregoing embodiment, but may be modified as follows:

(1) In the protective tape applying method described above, protective tape in roll form is applied in a plurality of plies to a wafer W while cutting the tape cut along the circumference of wafer W. Instead, the tape may be cut approximately to the shape of the wafer before application to the wafer.

(2) In the protective tape applying method described above, two apparatus are used for applying protective tape. Instead, one tape applying apparatus may be used for repeatedly applying different types of protective tape lot by lot.

(3) In the protective tape separating method described above, the chuck table 19 is movable in the tape running direction. Instead, the separating mechanism 20 itself may be adapted movable in the tape running direction.

(4) The protective tape separating method has been described by taking mount separation for example. However, the invention is not limited to mount separation. Protective tapes may be separated one by one from the surface of each wafer not supported by a mount frame.

This invention may be embodied in other specific forms without departing from the spirit or essential attributes thereof and, accordingly, reference should be made to the appended claims, rather than to the foregoing specification, as indicating the scope of the invention.

What is claimed is:

1. A method of applying protective tapes to a surface of a semiconductor wafer with a pattern formed thereon, said method comprising:

a step of applying the protective tapes to the surface of the wafer by repeating a process of applying each of said protective tapes.

2. A method of applying protective tapes as defined in claim 1, wherein said protective tapes applied in a plurality of plies to the surface of the wafer are progressively harder upward away from the surface.

3. A method of applying protective tapes as defined in claim 1, wherein the protective tapes applied in a plurality of plies to the surface of the wafer comprise a UV curable tape applied to the surface of the wafer, and a non-UV curable tape applied to said UV curable tape.

4. A method of applying protective tapes as defined in claim 1, wherein said protective tapes applied in a plurality of plies to the surface of the wafer are progressively softer upward away from the surface.

5. A method of applying protective tapes as defined in claim 1, wherein the protective tapes applied in a plurality of plies to the surface of the wafer comprise protective tapes of the same type.

6. A method of applying protective tapes as defined in claim 1, wherein each of said protective tapes is applied in a different direction.

7. A method of applying protective tapes as defined in claim 6, wherein the protective tapes are applied such that, after a first protective tape is applied to the surface of the wafer in a first direction, a next protective tape is applied in a direction perpendicular to said first direction.

8. A method of applying protective tapes as defined in claim 1, wherein a plurality of tape applying apparatus are used to apply the protective tapes to the surface of the wafer by repeating the process of applying each of said protective tapes.

9. A method of applying protective tapes as defined in claim 1, wherein one tape applying apparatus is used to apply the protective tapes to the surface of the wafer by repeating the process of applying each of said protective tapes.

10. A method of applying protective tapes as defined in claim 1, wherein the protective tapes applied to the surface of the wafer are in a strip form and are each cut substantially circumferentially of the wafer upon application to the surface of the wafer.

11. A method of applying protective tapes as defined in claim 1, wherein the protective tapes applied to the surface of the wafer are in a label form cut in advance substantially circumferentially of the wafer.

12. A method of separating a plurality of protective tapes applied to a surface of a semiconductor wafer with a pattern formed thereon, said method comprising:

a step of individually separating the plurality of protective tapes in plural times starting with an uppermost tape.

13. A method of separating protective tapes as defined in claim 12, wherein the plurality of protective tapes are separated such that, after a first protective tape is separated in a first direction, a next protective tape is separated in a direction perpendicular to said first direction.

14. A method of separating protective tapes as defined in claim 12, wherein the plurality of protective tapes are separated by varying separating directions in accordance with the pattern on the surface.

15. A method of separating protective tapes as defined in claim 14, wherein the plurality of protective tapes are separated along recesses formed in the pattern on the surface.

* * * * *